United States Patent [19]
Garnache et al.

[11] 4,295,924
[45] Oct. 20, 1981

[54] METHOD FOR PROVIDING SELF-ALIGNED CONDUCTOR IN A V-GROOVE DEVICE

[75] Inventors: Richard R. Garnache, South Burlington; Donald M. Kenney, Shelburne, both of Vt.

[73] Assignee: International Business Machines Corporation, Armonk, N.Y.

[21] Appl. No.: 103,981

[22] Filed: Dec. 17, 1979

[51] Int. Cl.³ .......................................... H01L 21/308
[52] U.S. Cl. ..................... 156/643; 156/647; 156/656; 156/657; 156/661.1; 156/662; 204/192 E
[58] Field of Search ............... 156/647, 649, 653, 656, 156/657, 648, 661.1, 662, 643; 357/55; 204/192 E

[56] References Cited

U.S. PATENT DOCUMENTS

| | | | |
|---|---|---|---|
| 2,980,830 | 4/1961 | Schockley | 357/55 |
| 3,892,608 | 7/1975 | Kuhn | 156/657 |
| 3,998,673 | 12/1976 | Chow | 148/175 |
| 4,105,475 | 8/1978 | Jenne | 156/647 |
| 4,120,744 | 10/1978 | Payne et al. | 156/653 |
| 4,163,988 | 8/1979 | Yeh et al. | 357/55 |
| 4,222,816 | 9/1980 | Noble et al. | 156/643 |

OTHER PUBLICATIONS

Lisiak et al., "Optimization of . . . Transistors", IEEE Transaction on Electron Devices, vol. 125, No. 10 (10/78), pp. 1229-1233.
Farzan et al., "Depletion V-Groove . . . Transistors", Solid-State Electronics, vol. 19, No. 4. (4/76), pp. 297-306.
Schiable et al., "Forming . . . Devices", IBM Technical Disclosure Bulletin, vol. 17, No. 10 (3/75), pp. 2893-2894.
Jenne, "Grooves . . . and Performance", Electronics (8/77), pp. 100-106.
Geldermans, "Making . . . of Masks", IBM Technical Disclosure Bulletin, vol. 19, No. 10 (3/77), pp. 3957-3958.
Garnache, "Methal . . . Phase Lines", IBM Technical Disclosure Bulletin, vol. 19, No. 7 (12/76), pp. 2471-2472.
Jambotkar, "Power . . . Transistor", IBM Technical Disclosure Bulletin, vol. 21, No. 5 (10/78), pp. 1884-1885.

Primary Examiner—Jerome W. Massie
Attorney, Agent, or Firm—Howard J. Walter, Jr.

[57] ABSTRACT

A method for providing self-aligned conductors in vertically integrated semiconductor devices which includes providing recesses in the surface of a semiconductor substrate for the fabrication of V-groove devices, providing a conductive layer over the surface and then applying a layer of masking material over the conductive layer to form a planar upper surface, selectively etching the masking material until it remains only in the recesses and then selectively etching the exposed portion of the conductive layer.

10 Claims, 8 Drawing Figures

METHOD FOR PROVIDING SELF-ALIGNED CONDUCTOR IN A V-GROOVE DEVICE

BACKGROUND OF THE INVENTION

1. Field of the Invention

This invention relates to methods of fabricating semiconductor devices, and more specifically, to methods of forming self-aligned high density electrodes or contacts to devices formed through the use of anisotropic etching, commonly referred to by the term V-groove technology, to provide recesses in semiconductor substrates which contain active devices or other associated elements.

2. Description of the Prior Art

For many years since the initial development of integrated circuit technology great efforts have been made to provide an ever increasing number of components, and thus their associated functions, on a single integrated circuit chip. Techniques to increase component density have always received great attention in the semiconductor industry. One of the technologies, recently adapted for providing increased density, utilizes recesses etched in the surface of a semiconductor substrate to enable fabrication of devices having vertical geometric features, thus reducing the lateral area required for layout of devices.

Although use of vertical device structures were proposed as early as 1956, see U.S. Pat. No. 2,980,830 to Shockley, it was not until recent years that available photolithographic limitations provided a barrier to density improvements in conventional planar integrated circuits. Vertical integration techniques, particularly in metal, oxide, semiconductor field-effect transistor (MOSFET) logic circuit design, provide desirable increases in density. See, for example, the article, "Grooves Add New Dimension to V-MOS Structure and Performance," F. B. Jenne, Electronics, Aug. 18, 1977, pp. 100–106. Further improvements in density in V-MOS technology using state of the art photolithographic processing are again limited by alignment tolerances as illustrated in FIG. 1 representing a typical prior art V-MOSFET.

Referring to FIG. 1, a V-MOSFET is shown in which a semiconductor substrate 10 of p-type material has a relatively thick thermal oxide layer 12 grown on its upper surface. A rectangular hole having a width y is etched in layer 12 exposing the surface of substrate 10. An n-type dopant such as arsenic or phosphorous is diffused through the hole to form a highly doped n-type region. Next, any oxide covering the n-type region is removed and a V-shaped notch or groove is anisotropically etched into substrate 10. By providing a substrate having its main surfaces parallel to the 100 plane of crystallinity, well known anisotropic etchants will etch preferentially along the 111 direction to form a self-stopping V-groove. Due to lateral diffusion of the n-type dopant, portions of the original n-type region remain as regions 14 and 16, subsequently to become the source and drain of the V-MOSFET. Next, a thin gate dielectric 18 is grown in the V-groove. Up to this point in the process it is possible to use only a single photoresist step and associated mask, as both the source, drain and V-groove may be formed in a self-aligned manner by a single photolithographic etching step which was used to form the initial hole in thick oxide 12. By using minimum mask geometry a very small device has been partially defined. In order to complete the V-MOS-FET, however, a gate electrode 20 is required which must be defined by a second photolithographic masking step. In order to insure proper positioning of the gate electrode, it is normally necessary to account for any mask alignment tolerances required between the registration of the gate forming mask and the mask previously used to define the remainder of the FET. In a process having a mask alignment error of ±d, in order to ensure proper coverage of the gate electrode, a minimum mask dimension x for the gate electrode must be equal to y+2d. Thus the minimum overall device dimension becomes y+2d, even though a substantial portion of the V-MOSFET has been fabricated using the minimum photolithographic dimension y. Techniques for providing a self-aligned gate electrode in such a process would enable further increases in density to be achieved. However, prior art techniques suitable for forming a self-aligned electrode within a recess such as a V-groove, all have decided disadvantages.

One prior art technique for forming a self-aligned electrode in a recess is illustrated in the article, "Making Conductive Platinum Membranes Across Holes in Silicon Without the Use of Masks," by P. Geldermans, *IBM Technical Disclosure Bulletin,* Vol. 19, No. 10, March 1977, pp. 3957–8. Here a thin conductive layer is deposited over a substrate containing a selectively etchable layer on its surface, except where the recess is to be provided. After deposition of the conductive layer the etchable layer is removed so that the overlying conductive layer is physically torn apart near the edges of the recess leaving the conductive layer only in the recess. The use of such lift-off techniques is highly dependent on the physical characteristics of the deposited conductive layer and has been found to have other undesirable processing limitations.

Another technique taught in U.S. Pat. No. 3,998,673 to Chow provides a self-aligned solid triangular-shaped electrode in an anisotropic V-groove by depositing a thick layer of polycrystalline semiconductor (polysilicon) entirely filling the V-groove and covering the surface of the substrate. Excess polysilicon and protective surface oxide are removed by lapping or polishing these layers flush with the surface of the substrate to provide a triangular-shaped polysilicon portion within the original substrate surface. Control of lapping processes is extremely difficult and the process provides a solid polysilicon layer, which may be undesirable for V-MOSFET applications.

A related technique is apparently used, but not described in detail, in the article, "Optimization of Nonplanar Power MOS Transistors," by K. P. Lisiak et al, IEEE Transactions on Electron Devices, Vol. ED-25, No. 10, October 1978, pp. 1229–34. There in FIG. 7(d) there is shown a self-aligned gate electrode for a V-MOSFET which is apparently formed by lapping the surface of the partially completed device to planarize the upper edges of the gate electrode with the surface of the substrate.

A similar isolated polysilicon structure and method are taught in U.S. Pat. No. 4,120,744 to Payne et al. Here a triangular section of polysilicon is provided in an oxidized V-groove by selectively etching a thick polysilicon layer overlying both V-grooves and the substrate to a level below the surface of the substrate. In an alternative technique, illustrated in FIGS. 9–19, a thin layer of polysilicon is provided over an oxide protected surface containing V-grooves. After the thin oxide layer is provided over the polysilicon, a layer of photoresist is provided which is then patterned to leave a thin layer of photoresist over a portion of the polysilicon entirely within the oxide covered V-grooves. Next the exposed oxide and polysilicon layers are selectively etched leaving the photoresist-protected silicon dioxide and polysilicon within the V-grooves. This last technique is difficult to execute, as the mask, not described, to pattern the photoresist must be aligned within the recessed portion of the V-grooves. Use of the technique inherently requires that the V-groove be formed using a mask having openings for the V-grooves substantially larger than the minimum photolithographic dimensions.

Other references believed to be related to the subject invention include the following documents. The article, "Method for Forming Phase Lines," by R. R. Garnache, *IBM Technical Disclosure Bulletin,* Vol. 19, No. 7, December 1976, pp. 2471–2, which teaches the selective etching of raised portions of conductive polysilicon lines passing over an undulating substrate by applying a relatively thick layer of photoresist over the substrate, ion implanting conductivity determing impurities to a depth sufficient to penetrate the thickness of only the raised portions of the polysilicon lines, removing the photoresist and selectively etching those raised portions of the polysilicon in preference to those portions not ion implanted to yield polysilicon lines only in those regions of the substrate which were initially not raised. The article, "Forming Sidewall Dielectric Isolation of Integrated Circuit Devices," by P. M. Schaible et al, *IBM Technical Disclosure Bulletin,* Vol. 17, No. 10, March 1975, pp. 2893-4, is of interest as it teaches the use of dry reactive ion etching of a thick organic polymer layer overlying a substrate containing V-grooves in order to planarize the surface of the substrate leaving polymer filled V-grooves. The article, "Isolation of Device Components," G. T. Galyon, *IBM Technical Disclosure Bulletin,* Vol. 18, No. 6, November 1975, pp. 1854, is of interest as it teaches a method of forming dielectrically isolated regions in a semiconductor substrate in which a photoresist is illustrated as only partially filling an etched groove in the substrate. However, no process is disclosed as to how such a configuration is obtainable. Co-pending U.S. patent application, Ser. No. 973,219, entitled, "Method for Reducing Parasitic Capacitance in Integrated Circuit Structures," of W. P. Noble et al, filed on Dec. 26, 1978, now U.S. Pat. No. 4,222,816, may also be of interest as it teaches the removal of the raised portions of conductive polysilicon lines by the uniform removal of a thick layer of photoresist to expose only the tops of the raised portions of the polysilicon lines, which are subsequently etched. Finally, U.S. Pat. No. 4,163,988 to Yeh et al is of interest as it illustrates V-MOSFET devices having conductive polysilicon electrodes which terminate within a V-groove below the surface of a substrate, but does not teach how such a structure may be formed.

SUMMARY OF THE INVENTION

Accordingly, it is an object of the invention to provide increased density of integrated circuit devices manufactured in V-groove technology.

A more specific object is to provide self-aligned electrodes for use in V-groove technology.

Briefly, these objects are accomplished by providing recesses in the surface of a semiconductor substrate for the fabrication of V-groove devices and other elements. After optional processing steps, related specifically to the particular V-groove device being fabricated, a layer of conductive material suitable to form an interconnecting electrode layer is deposited. The surface of the partially processed substrate is then flooded with a mask forming material such as photoresist or other polymeric material normally used in the manufacture of semiconductor devices. The organic material is applied so that its upper surface is substantially flat. A material selective etching step is then performed to remove the organic material until it remains only in the conductor covered V-grooves. The remaining organic material is then used as an etch mask in order to etch exposed portions of the conductive layer. After stripping the remaining organic material from the substrate there remains a self-aligned conductor within the V-grooves having a lateral dimension less than that of the top of the V-groove. By use of non-critical blocking masks definition of the conductive layer may also be provided on areas of the substrate outside of the V-grooves.

These and other objects, features and advantages of the invention will be apparent from the following more particular description of the preferred embodiments of the invention, as illustrated in the accompanying drawings.

BRIEF DESCRIPTION OF THE DRAWINGS

FIG. 3 shows the device after application of a self-leveling photoresist layer. FIG. 4 shows the device after partial removal of the photoresist layer. FIG. 5 shows the same device after selective etching of the conductor using retained photoresist as a mask.

DESCRIPTION OF THE PREFERRED EMBODIMENTS

Figure 2:
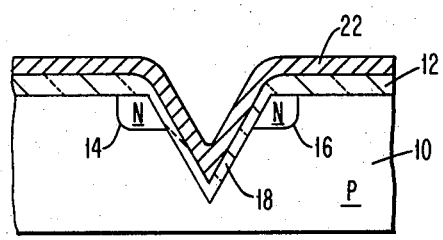

Referring now to FIG. 2 there is shown a partially fabricated V-groove MOSFET device comprising, for example, a lightly p-doped silicon substrate 10. Highly doped n-type regions 14 and 16 may be provided by solid state diffusion through a hole provided in dielectric layer 12, preferably of silicon dioxide. Through the same hole in layer 12 an anisotropic etchant such as hydrazine and water, as described in the article, "Optimization of the Hydrazine-Water Solution for Anisotropic Etching of Silicon in Integrated Circuit Technology," by M. J. Declercq et al, *Journal of the Electro-*

*chemical Scoiety*, Vol. 122, No. 4, April 1975, pp. 545-552, is used to etch a V-shaped groove in the upper surface of substrate 10. If the upper surface of substrate 10 has been cut to be parallel to the 100 crystal plane, the sidewalls of the V-groove will be parallel to the 111 plane forming an angle of about 54.7° with respect to the 100 plane. If allowed to proceed, the etched groove will tend to be self-stopping and will appear as shown. After the formation of the V-groove, a thin thermal oxide 18 is grown on the exposed sidewalls of the groove to provide a gate oxide layer. Subsequent to the formation of the oxide layer 18 a layer 22 of conductive electrode forming material such as aluminum or polysilicon is deposited by techniques well known in the art. For typical fabrication processes for various different types of V-groove devices see, for example, U.S. Pat. No. 4,065,783 to Ouyang; the article, "VMOS—A New MOS Integrated Circuit Technology," by F. E. Holmes et al, *SolidState Electronics*, Vol. 17, pp. 791-797; or the previously identified Electronics article.

Although a simplified MOSFET device is described here, it will be clear to those skilled in the art that any of the many known V-groove technology structures, including the types in the above references, may be used to practice this invention.

Figure 3:
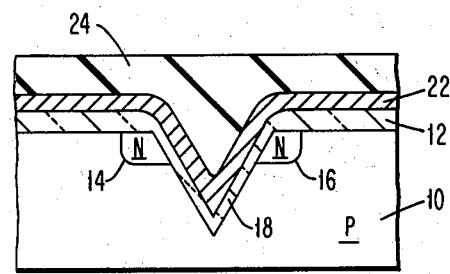

Subsequent to providing conductive layer 22, a layer 24, FIG. 3, of mask forming material such as a photoresist is provided to cover the surface of the substrate filling in the V-grooves and providing a substantially planar upper surface. Although many materials known to be used in semiconductor processing may be used, a photoresist is preferred, such as AZ1350J, a product of the Shipley Company, Newton, Massachusetts. Photoresist layer 24 may be applied by dispensing it on the surface of the substrate and spinning at 5000 rpm to provide a thickness of about 0.6 microns, excluding the depth of the V-groove. Following application of the photoresist, the substrate is heated at about 90° C. for 20 minutes to remove solvents and harden the resist.

Figure 4:
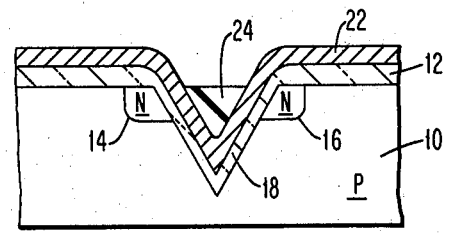

Next, as shown in FIG. 4, the upper portion of photoresist layer 24 is removed by an etching process selective to the photoresist. One preferred technique is to blanket expose the substrate to ultra-violet light in a standard exposure machine without using a mask. This will render the photoresist soluble to the standard alkaline AZ-Developer, which can be diluted by a ratio of 5:4 with water in order to reduce the development rate to a value which allows visual determination of the stopping point. Development times of 1 to 3 minutes are desirable. Because the removal of only a portion of photoresist layer 24 is not self-stopping, some form of monitoring is required in order to stop the development at a point after the surface of the conductive layer 22 becomes exposed. Visual observation is suitable, but more accurate optical monitoring techniques may be adapted from those presently used in manufacturing semiconductor devices.

Figure 1:
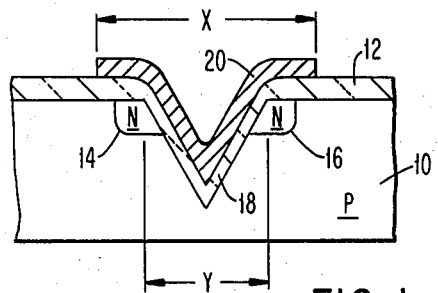
FIG. 1 is a cross-sectional view of a V-groove MOSFET device having a gate electrode structure typical of the prior art and shows the width x of the gate electrode required to ensure adequate area coverage when a conventional photolithographic masking step is used to define the electrode structure.
Figure 5:
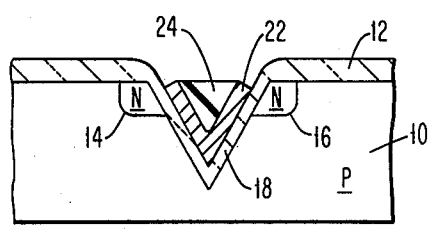
FIGS. 2–5 are cross-sectional views of a semiconductor substrate at various stages of processing in accordance with the invention and illustrate, in FIG. 2 a partially fabricated VMOS transistor.

Following the etching or removal of most of layer 24, the substrate with the remaining photoresist is baked at about 130° C. for about 30 minutes to further harden the photoresist. Thereafter, a suitable etchant selective to the material of conductive layer 22 is used to remove all of layer 22 except where photoresist layer 24 is retained, see FIG. 5.

Finally, remaining photoresist is stripped in a well known manner using a wet or a dry etching process.

In the above process, particularly if the end point of the photoresist step is to be determined visually, it is desirable to initially apply layer 24 with a thickness, excluding the depth of the V-grooves, such that the portion being removed is thinner than the depth in the V-groove which is to be retained. For example, in the process described a V-groove depth of about 2 microns was used. The thickness of the photoresist layer is preferably about 0.6 microns. The relative thickness of material to be removed with respect to that retained combined with a diluted developer requires a less critical determination of the end point.

Figure 6:
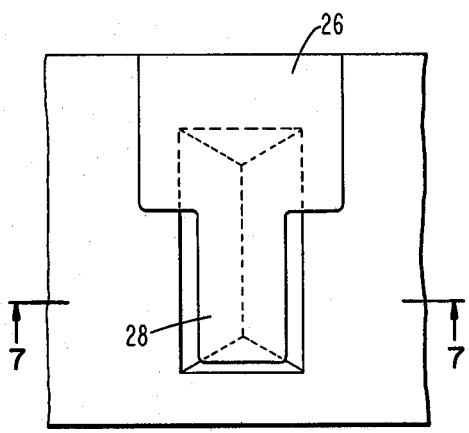
FIG. 6 is a plan view of a V-groove device having one portion of a conductive layer defined by the self-aligned process shown in FIGS. 2–5 and another portion of the conductive layer formed as in the prior art with the aid of a blocking mask.
Figure 7:
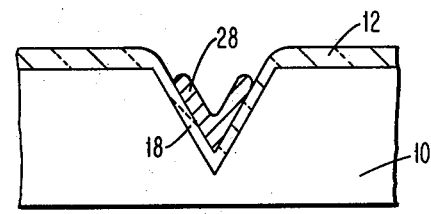
FIG. 7 is a cross-sectional view of the device in FIG. 6 along lines 7—7 and illustrates the self-alignment of a part of the conductive layer with respect to the V-groove.

FIGS. 6 and 7 illustrate another embodiment of the invention. FIG. 7 shows a plan view of a semiconductor substrate having a conductive electrode 26 on its surface which has a first self-aligned portion 28 formed within a V-groove and a second portion formed partially within the V-groove and partially on the flat surface of the substrate. The method for making the device of FIG. 6 can be the same as that shown in FIGS. 2-5, except that prior to etching the conductive layer a noncritical blocking mask, not shown, is provided to cover areas of the conductive layer to be retained. This mask may be an additional photoresist layer applied, for example, over the upper portion 26 of the conductor shown in FIG. 6. If the same photoresist material is used for the blocking mask as was used for the initial self-aligned mask, curing of the first photoresist may be required to prevent the residual portion of layer 24 from being dissolved. Subsequent etching of the conductive layer results in self-aligned portion 28, while the remaining portion 26 of the conductive layer is retained as in the prior art. FIG. 7 is a sectional view showing the self-aligned conductor portion 28 formed within the V-groove. The device structure in FIGS. 6 and 7, although illustrated as a MOS capacitor, could be any of the known V-groove devices.

Figure 8:
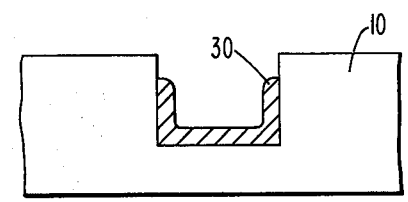
FIG. 8 is a cross-sectional view of another embodiment in which the recess is rectangular and illustrates a self-aligned substrate contact having an effectively increased area over that of a planar contact.

FIG. 8 illustrates another form of the invention in which a groove having substantially vertical side walls is used in conjunction with the processes described above. Here semiconductor substrate 10 is provided with a rectangular groove by sputter etching or other directionally dependent etching process, including anisotropic etching provided proper initial orientation of the surface of the substrate is observed. Here a self-aligned electrode 30 has been provided which forms a contact to substrate 10.

While the invention has been described in terms of a number of specific embodiments, those skilled in the art will recognize that the various steps may be carried out by using different equivalent steps and materials. For example, the conductive layer may be formed of various additional materials other than aluminum or polysilicon and that various definition methods such as subtractive etching or lift-off techniques may be used to initially define the conductive layer. As pointed out in FIGS. 7, 8 and 9, the shape of the substrate recess may take various forms and may or may not include the presence of a dielectric layer prior to providing the conductive layer.

What is claimed is:

1. The method of providing a conductive electrode for a semiconductor device comprising the steps of:
   providing a semiconductor substrate having a surface containing at least one recessed groove to which an electrode is to be provided;
   depositing a substantially uniform layer of electrode forming material over at least a portion of said surface including all of said groove;

dispensing a layer of mask-forming organic material over said layer of electrode forming material and said surface to a depth sufficient to provide a substantially planar upper surface;

heating said substrate to harden said layer of mask-forming organic material;

selectively etching said layer of organic material in preference to said electrode forming material to a depth below the level of the surface of said substrate to expose the portion of said layer of electrode forming material outside of the area of said groove;

applying a blocking mask over at least a part of said exposed layer of electrode forming material adjacent to, and extending over one end of the area of said groove;

selectively etching and removing said layer of electrode forming material in preference to said masking material and said blocking mask to provide an electrode on said substrate having a first etch-defined portion terminating within said groove below said surface of said substrate and a second connected portion remaining on said surface; and removing both said masking material and said blocking mask.

2. The method of claim 1 wherein said recessed groove is formed by a directionally dependent etching process.

3. The method of claim 2 wherein said directionally dependent etching process is an anisotropic etching process.

4. The method of claim 3 wherein said groove is substantially V-shaped in cross-section.

5. The method of claim 2 wherein said groove is substantially rectangular in cross-section.

6. The method of claim 5 wherein said directionally dependent etching process comprises a sputtering step.

7. The method of claim 1 wherein said electrode forming material comprises a metal.

8. The method of claim 1 wherein said electrode forming material comprises polycrystalline silicon.

9. The method of claim 1 wherein the step of providing said substrate further comprises the steps of:

providing a silicon semiconductor substrate of a predetermined conductivity type;

forming a first dielectric layer on said first surface of said silicon semiconductor substrate;

providing at least one opening in said dielectric layer to expose a region of said first surface; and anisotropically etching said exposed region to form said groove therein.

10. The method of claim 9 wherein the step of anisotropically etching is followed by the step of:

providing a second dielectric layer within said groove.

* * * * *